United States Patent [19]

York

[11] 3,932,797

[45] Jan. 13, 1976

[54] SELF-TESTING BATTERY DISCHARGE INDICATOR

[75] Inventor: Robert A. York, Mechanicsburg, Pa.

[73] Assignee: Flight Systems, Inc., Mechanicsburg, Pa.

[22] Filed: Dec. 24, 1974

[21] Appl. No.: 536,134

[52] U.S. Cl. .................................. 320/48; 340/249
[51] Int. Cl.² ...................... G08B 21/00; H02J 7/00
[58] Field of Search .......... 320/39, 40, 48; 340/248, 340/249; 318/139

[56] References Cited
UNITED STATES PATENTS

| | | | |
|---|---|---|---|
| 3,568,175 | 3/1971 | Schwehr | 340/249 |
| 3,673,588 | 6/1972 | Riff | 340/249 X |
| 3,852,732 | 12/1974 | Yorksie et al. | 320/48 X |

*Primary Examiner*—J. D. Miller
*Assistant Examiner*—Robert J. Hickey
*Attorney, Agent, or Firm*—Seidel, Gonda & Goldhammer

[57] ABSTRACT

The voltage of a battery connected to a load is automatically indicated with respect to two voltage levels. A first indicating means indicates that the battery voltage is greater than a first voltage level, and a second indicating means indicates that the battery voltage is less than the first voltage level but greater than a second voltage level. A third indicating means indicates that the battery voltage is less than both the first and second voltage levels and disables the load connected to the battery.

Means are provided for selectively generating a control signal either in response to the battery voltage or at a decay rate independent of the battery voltage. In a normal operating mode, the control signal is determined by the actual decay rate of the battery voltage whereas, in a self-test mode, the control signal decays at a fixed decay rate independent of the actual battery voltage. The first, second and third indicating means operate in response to the control signal.

35 Claims, 5 Drawing Figures

SELF-TESTING BATTERY DISCHARGE INDICATOR

BACKGROUND OF THE INVENTION

The present invention relates to a battery discharge indicator. More particularly, the present invention relates to a battery discharge indicator which indicates the voltage of the battery and automatically disconnects a load connected to the battery when the battery voltage drops below a predetermined value. Furthermore, the present invention relates to battery discharge indicators having a self-test capability and tamper-proof features.

Various devices for sensing the state of charge of a battery and for disconnecting a load connected to the battery are known in the prior art. A battery connected to a load will drive the load until the battery is incapable of supplying the current necessary for proper operation of the load. For example, a truck battery connected to a lift pump will drive the pump until the continued loading of the battery causes the battery charge to be depleted so that the battery can no longer supply the required voltage for operating the pump.

Although devices are known for sensing the state of charge of a battery and for disconnecting a load connected to the battery when the charge drops below a predetermined discharge level, these devices do not disconnect the load until the charge on the battery drops below the predetermined discharge level for a specified period of time. Many of the foregoing devices provide no visual indication of the state of charge of the battery so that the load continues to drain the battery of its charge until the load is automatically after the specified interval of time has expired. Accordingly, an operator is not given the opportunity to disconnect the load from the battery and to re-charge the battery before it becomes substantially depleted of its charge.

Additionally, continued operation below the predetermined discharge level for the specified interval of time before disconnection of the load results in further draining of the battery and, unless the discharge level is chosen to be sufficiently modest, the battery may become damaged by the time disconnection takes place.

Furthermore, conventional devices for indicating the state of charge of a battery do not have a self-test capability. That is, these devices operate only in response to the actual rate of decay of the battery charge. Consequently, a conventional device may be defective, as manufactured, or may malfunction during the course of operation, and be unable to disconnect the load from the battery when the predetermined discharge level is reached. As a result, the battery may become damaged permanently due to the continued operation below the discharge level.

For these reasons, a battery discharge indicator device is needed for automatically indicating the state of charge of the battery and for providing the operator with an opportunity to disconnect the battery from the load so that it can be removed and recharged. During automatic operation, such a device should be capable of disconnecting the load when, due to component failure, the defice is unable to provide an indication that the battery voltage has dropped below the predetermined discharge level. Further, during automatic operation, the device should be relatively immune to sudden disconnection and reconnection of the battery. The device should also have a self-test capability to forewarn the operator that the device will not operate to indicate the state of charge of the battery or disconnect the load when the battery charge is sufficiently depleted.

Moreover, it is desirable that the self-test capability operate under a variety of fortuitous conditions. For example, it is desirable that the self-test capability remain operative despite the level of discharge of the battery; regardless of the presence of a load at the output terminals of the battery; and despite operator error in prolonging the self-test operation of the device. In addition, the self-test feature of the device should be operable at any time during the automatic operation of the device without interrupting that operation.

A principal advantage of the present invention is that it automatically indicates the state of charge of a battery with respect to two voltage levels, thereby permitting the operator to remove the battery and re-charge it before the load is automatically disconnected.

Another advantage of the present invention is that the battery can be safely operated under load, although the opportunity for removing and re-charging the battery has passed, and then automatically disconnected from the load as soon as the battery voltage reaches the predetermined discharge level.

Yet another advantage of the present invention is that it can automatically disconnect a load connected to the battery when, due to component failure, the indication that the battery voltage has dropped below the predetermined discharge level cannot be provided.

An additional advantage of the present invention is that it can operate automatically to indicate the state of charge of the battery despite sudden disconnection and reconnection of the battery.

A further advantage of the present invention is that the battery voltage need not remain below the predetermined discharge level for a preselected period of time before the load can be automatically disconnected.

A still further advantage of the present invention is that it can automatically test itself.

A still further advantage of the present invention is that it can automatically test itself despite the level of discharge of the battery; regardless of the presence of a load at the output terminals of the battery; and despite operator error in prolonging the self-test operation of the invention.

Other advantages appear below in the detailed disclosure of the invention.

BRIEF SUMMARY OF THE INVENTION

Briefly, in the present invention, means are provided for selectively generating a control signal either at a fixed decay rate independent of the actual decay rate of the battery voltage or at a decay rate in response to the actual decay rate of the battery voltage. Under normal operating conditions, the control signal decays at a rate determined by the actual decay rate of the battery voltage; but operating in a self-test mode, the control signal decays at a fixed rate independent of the actual decay rate of the battery voltage. In response to the control signal, a sensing means senses that the battery voltage is greater than a first voltage level, less than the first voltage level or greater than a second voltage level, or less than both the first and second voltage levels, and generates two control signals which take on different values according to the foregoing conditions.

The two control signals generated by the sensing means control the operation of means for selectively energizing first, second, and third indicating means. If the battery voltage is greater than the first voltage level, the two control signals generated by the sensing means cause the selectively energizing means to energize the first indicating means. If, however, the battery voltage is less than the first voltage level but greater than the second voltage level, the two control signals cause the selectively energizing means to energize the second indicating means. And, if the battery voltage is less than both the first and second voltage levels, the two control signals cause the selectively energizing means to energize the third indicating means. In addition to indicating that the battery voltage is less than both the first and second voltage levels, the third indicating means automatically disables the load.

It should be understood that, although the sensing means has been described as sensing the battery voltage, the sensing means is controlled by the control signal generated by the selectively generating means, and this control signal may decay at a fixed rate independent of the actual voltage of the battery or at a rate determined by the actual voltage of the battery. That is, under normal operating conditions, the sensing means is controlled by a control signal which is derived from the actual battery voltage so that the sensing means senses indirectly the actual decay rate of the battery voltage. On the other hand, in the self-test mode, the control signal decays at a fixed decay rate independent of the actual decay rate of the battery voltage so that the sensing means senses the decay rate of an ideal battery voltage rather than the actual battery voltage. In either case, however, the sensing means is described as sensing a battery voltage.

Figure 1A:
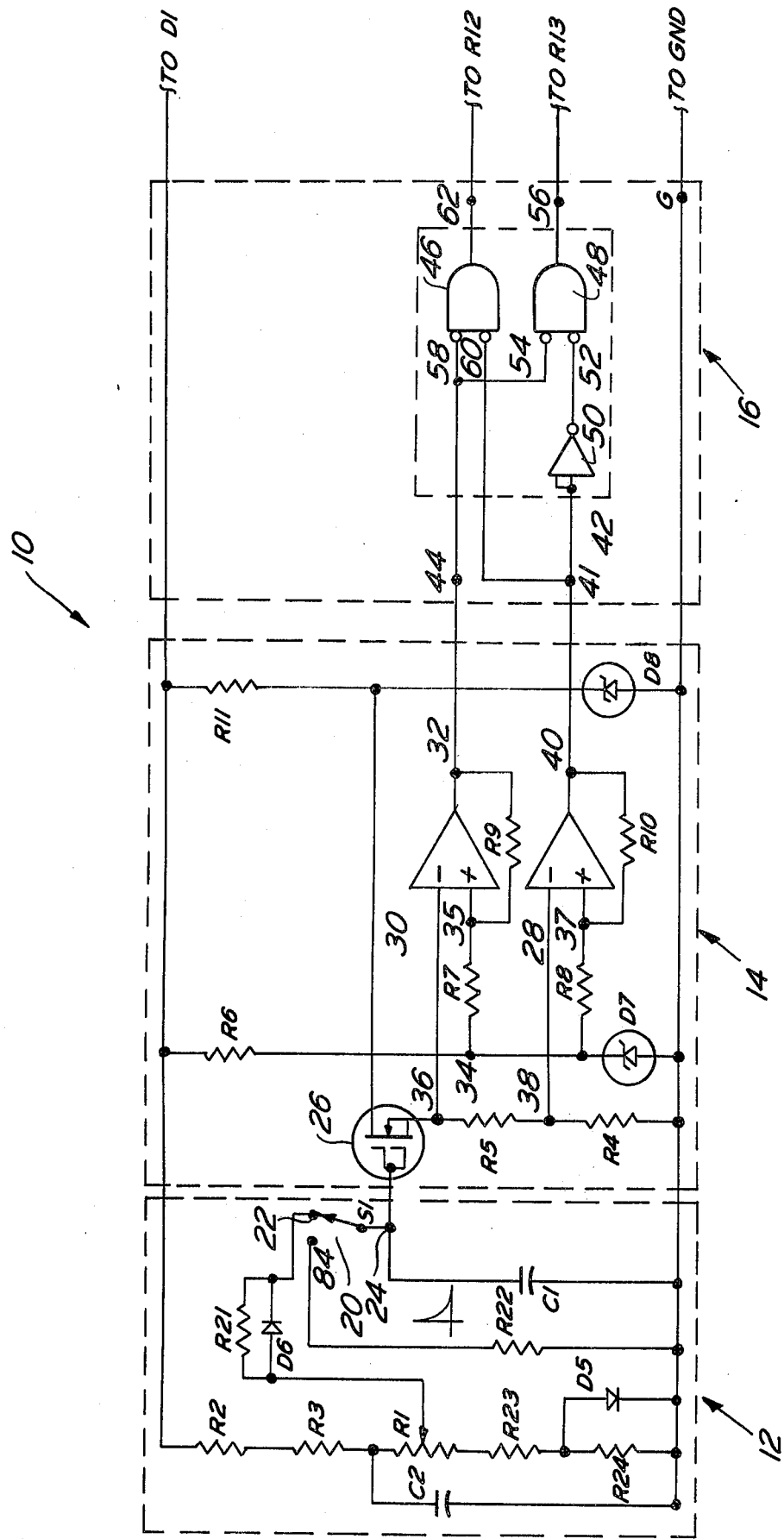
FIGS. 1A and 1B together form a schematic diagram of a self-testing battery discharge indicator circuit constructed in accordance with the principles of the present invention.

For the purpose of illustrating the invention, there are shown in the drawings forms which are presently preferred; it being understood, however, that this invention is not limited to the precise arrangements and instrumentalities shown.

DETAILED DESCRIPTION OF THE INVENTION

Figure 1B:
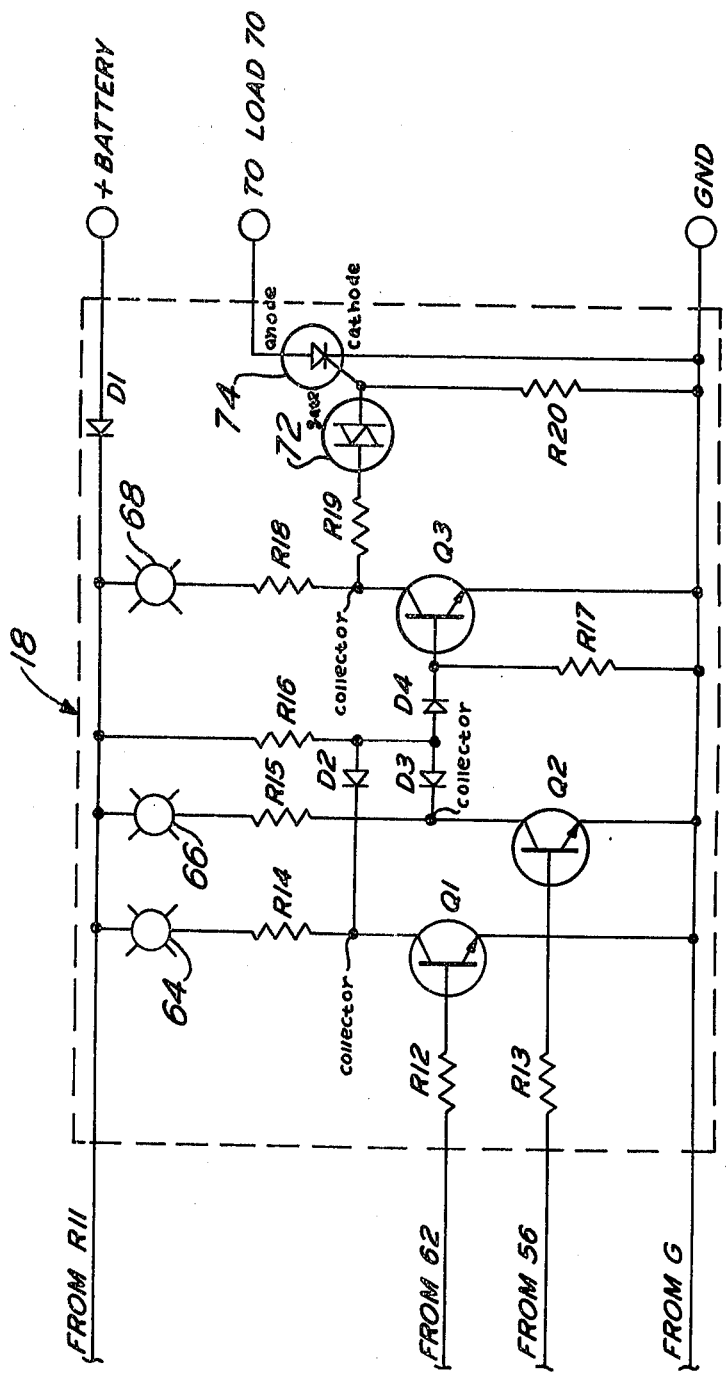

Referring to the drawings, wherein like numerals indicate like elements, a battery, such as a vehicle battery used in a fork lift truck, is connected to a load 70 and to a battery discharge indicator and self-test circuit constructed in accordance with the principles of the present invention and designated generally as 10 in FIGS. 1A and 1B. More specifically, the battery is connected to circuit 10 which includes an input and timing circuit 12, a threshold circuit 14, a gating logic circuit 16, and an output indicator and driving circuit 18.

Typically, a vehicle battery contains eighteen cells and supplies a nominal dc voltage of 36 volts. Actually, the battery does not supply exactly 36 volts; instead, it supplies approximately 32 to 39 volts. For purposes of the following description of the invention, it is assumed that the battery shown in FIG. 1A and 1B supplies a normal dc voltage of 36 volts, that is, an actual voltage of approximately 32 to 39 volts. It should be understood, however, that the present invention can operate in connection with other batteries having different numbers of cells and nominal voltages. For instance, the present invention can also be used in connection with batteries having nominal dc voltages of 12, 18, 24, 36, 48, 72 or 96 volts.

Referring to FIGS. 1A and 1B, the battery is connected through a double pole, single throw switch 20 in input and timing circuit 12 to threshold circuit 14. In particular, switch 20 includes three terminals, 22, 24 and 84, and a contact arm S1 connected to terminal 24. The switch 20 may be any suitable two position switch; by way of example, it may be a momentary contact switch which, in one position, connects terminals 24 and 22, and in the other position connects terminals 24 and 84. Operating under normal load conditions, switch 20 connects switch terminal 22 to switch terminal 24 which is connected to the gate terminal of an IGFET device 26 in threshold circuit 14.

The IGFET 26 is a two-gate, four terminal, depletion type, n-channel field effect transistor, andd the two gate terminals of IGFET 26 are connected together and to switch terminal 24. That is, IGFET 26 is connected to operate as a three terminal device with unity circuit gain and fixed voltage offset. The source terminal of IGFET 26 is connected through resistors R5 and R4 to ground, and the drain terminal is connected through resistor R11 to the battery and through Zener diode D8 to ground. Accordingly, a positive voltage is established between the drain and source terminals of IGFET 26. In addition, since the battery is connected to input and timing circuit 12, a positive voltage appears at switch terminal 22 and, therefore, at the gate input terminals of IGFET 26, and current flows through the drain-to-source channel of the IGFET.

The battery is also connected to load 70, and with time the battery becomes drained and the battery voltage decreases. As the battery voltage decreases, the gate-to-source voltage of IGFET 26 decreases as well. As a result, the current in the drain-to-source channel of IGFET 26 decreases, causing a drop in the potentials across resistors R4 and R5. The decreases in potential across resistors R4 and R5 are sensed, respectively, by differential amplifiers 28 and 30 in threshold circuit 14.

The differential amplifier 30 is connected according to principles well-known in the art to operate as a high gain dc comparator with positive feedback for a controlled amount of hysteresis to prevent chattering during switching. Specifically, output terminal 32 of differential amplifier 30 is connected to its input terminal 35 through resistor R9, and input terminal 35 is connected through resistor R7 to terminal 34. In addition, input terminal 36 of differential amplifier 30 is connected to the source terminal of IGFET 26.

The output signal at terminal 32 of differential amplifier 30, therefore, is switched between two voltage levels in response to the difference between the voltages appearing at terminal 34 and input terminal 36. In particular, the two voltage levels at the output terminal 32 correspond to the "high" and "low" voltage levels used in the digital logic circuitry to be described hereinafter. Thus, differential amplifier 30 provides a digital logic output in response to the amplitude relationship between two analog input signals.

Terminal 34 is connected through a resistor R6 to the battery, and through Zener diode D7 to ground. Therefore, a relatively constant voltage signal appears at terminal 34. In contrast, the voltage signal at input terminal 36 fluctuates in response to a decrease in the battery voltage.

As mentioned previously, as the battery voltage decreases so does the gate-to-source voltage of IGFET 26. Further, the current through the drain-to-source channel of IGFET 26 decreases with decreasing gate-to-source voltage so that the voltage at input terminal 36 also decreases, providing an indication of the battery voltage. The difference signal developed between terminals 34 and 36 therefore fluctuates with decreasing battery voltage. Accordingly, the output signal of differential amplifier 30, developed at terminal 32, switches between the "high" and "low" digital voltage levels in response to the decreasing battery voltage.

Differential amplifier 28 is also connected to operate as a high gain dc comparator with positive feedback for a controlled amount of hysteresis to prevent chattering during switching. In particular, resistor R10 is connected to output terminal 40 and to input terminal 37, which is connected through resistor R8 to Zener diode D7 and resistor R6. Input terminal 38 is connected through resistor R5 to the source terminal of IGFET 26. When the drain-to-source current in IGFET 26 decreases, the potential developed at input terminal 38 also decreases, and the output signal at terminal 40 switches between the high and low voltage levels. In other words, the output signal of differential amplifier 28, developed at terminal 40, switches in response to decreasing battery voltage.

Although the output signals of differential amplifiers 28 and 30 switch in response to decreasing battery voltage, the output of differential amplifier 28 switches before the output of differential amplifier 30. More particularly, the voltage developed at input terminal 36 of differential amplifier 30, due to the flow of drain-to-source current through IGFET 26 and resistors R4 and R5, exceeds the voltage developed at input terminal 38 of differential amplifier 28 due to the flow of the same current through resistor R4. Therefore, although the difference signals at the inputs to differential amplifiers 28 and 30 decrease at the same rates with decreasing drain-to-source current through IGFET 26, the voltage at terminal 38 will trigger differential amplifier 28 before the voltage at terminal 36 triggers differential amplifier 30. The output signal developed by differential amplifier 28, at terminal 40, switches before the output signal developed at terminal 32 of differential amplifier 30 does.

The output signals of differential amplifiers 28 and 30 appear, respectively, at the input terminals 41 and 44 of gating logic circuit 16, since output terminal 32 of differential amplifier 30 is connected to input terminal 44 and output terminal 40 of differential amplifier 28 is connected to input terminal 41. As mentioned previously, the outputs of differential amplifiers 30 and 28 change suddenly in response to changing input voltages. Specifically, when a fresh battery is used, the voltage at terminals 36 and 38 will be sufficiently great to cause the outputs 32 and 40 of differential amplifiers 30 and 28 to be at digital logic low voltage levels. As shown more fully hereinafter, as the voltages at terminals 36 and 38 decrease with decreasing battery voltage, the outputs 32 and 40 switch in sequence from the digital logic low voltage level to a digital logic high voltage level.

Gating logic circuit 16 comprises NOR gates 46 and 48 and an inverter 50, and it controls the operation of output indicator and driving circuit 18, see FIG. 1B. Gates 46 and 48 are digital logic devices which produce high or low level output voltage signals depending upon the levels of the voltage signals appearing at their inputs. Specifically, if both inputs of either NOR gate 46 or 48 are at the low level, the NOR gate will generate a high level output signal; for all other combinations of input signals, the NOR gate output will be low. A high voltage level corresponds to a binary logic state usually designated as 1, and a low voltage level corresponds to a binary logic state usually designated as 0. In general, all voltage levels below a specified logic threshold voltage are considered to be low, and all voltage levels above that threshold voltage are considered to be high. Consequently, when a voltage signal crosses the logic threshold voltage, there is a transition between the low and high levels; in other words, there is a transition between binary logic states.

Initially, as described above, the voltages at output terminals 32 and 40 are below the threshold voltage which separates the high and low logic levels. That is, the signals at output terminals 32 and 40 are initially low. As the drain-to-source current through IGFET 26 decreases with decreasing battery voltage the voltages at terminals 32 and 40 switch in sequence from a low to a high voltage level. The voltage at terminal 40 switches to the high level before the voltage at terminal 32 does since the voltage at terminal 38 triggers differential amplifier 28 before the voltage at terminal 36 triggers differential amplifier 30. Stated otherwise, as the battery voltage decreases, the output voltage at terminal 40 first undergoes a transition in logic levels—from low to high—while the output voltage at terminal 32 of differential amplifier amplifier 30 remains at the low logic level.

The transition in logic levels from low to high at terminal 40 appears at terminal 41 which is connected to input terminal 42 of inverter 40 and input terminal 60 of NOR gate 46. Inverter 50 inverts a logic level appearing at its input, and it produces a logic level transition from high to low at input terminal 52 of NOR gate 48 in response to the low to high level transition at terminal 40. At the same time, the output signal at terminal 32 of differential amplifier 30 is at the low logic level, and this signal appears at input terminal 58 of NOR gate 46 and input terminal 54 of NOR gate 48, terminals 58 and 54 being connected together and to terminal 32 through terminal 44.

Before the transition in logic levels described above, the output of inverter 50 is high, the input signal at terminal 54 is low, and the NOR gate 48 output at terminal 56 is low, keeping transistor $Q_2$, see FIG. 1B, off. At the same time, the input terminals 58 and 60 to NOR gate 46 are low and, therefore, the output of NOR gate 46 at terminal is high, turning transistor $Q_1$ on.

Referring to FIG. 1B, transistor $Q_1$ is provided with a lamp 64 in its collector circuit, and since transistor $Q_1$ is initially turned on when the outputs 32 and 40 of differential amplifiers 30 and 28 are low, current flows in its collector circuit, thereby energizing lamp 64. Transistor $Q_2$ is provided with a lamp 66 in its collector circuit, and since transistor $Q_2$ is initially off, no current flows in its collector circuit and lamp 66 is not energized. When transistor $Q_1$ is initially on, its collector terminal is effectively clamped to ground and diode $D_2$ is forward biased. In addition, since transistor $Q_2$ is off, its collector terminal is effectively at the battery voltage, and diode $D_3$ is reverse biased. Further, diode $D_4$ is also reverse biased when the collector of transistor $Q_1$ is clamped to ground so that transistor $Q_3$ is also off. Transistor $Q_3$ is provided with a lamp 68 in its collector circuit, but since transistor $Q_3$ is off at this time the lamp 68 is not energized.

Therefore, when the battery is not sufficiently drained to cause a transition in logic levels at terminals 32 or 40, transistor $Q_1$ and lamp 64 are turned on, and transistors $Q_2$ and $Q_3$, and lamps 66 and 68, are off. In a preferred embodiment of the invention, for a battery having a nominal output voltage of 36 volts, this condition is realized when the battery voltage is above approximately 36.45 volts. The battery may be recharged whenever the battery voltage drops below approximately 36.45 volts. But, when the battery voltage is above the 36.45 volt level, lamp 64 indicates that the battery need not be recharged. Although a level of 36.45 volts has been specified for determining when the battery should be recharged, it should be understood that it is obvious to a person of ordinary skill in the art to modify the circuit described herein to operate the circuit in the same fashion at voltage levels greater or less than 36.45 volts. In the preferred embodiments shown in FIG. 1 and described further hereinafter, a level of approximately 36.45 volts is used to indicate that the battery requires charging, without limiting the spirit or scope of the invention.

When, in the preferred embodiment, the battery voltage drops below approximately 36.45 volts, the voltage at terminal 38 triggers differential amplifier 28. The output signal at terminal 40 of differential amplifier 28, therefore, undergoes a transition in logic levels from low to high. This transition appears, through terminal 41, at input terminal 60 of NOR gate 46 and, in inverted form at input terminal 52 of NOR gate 48. The logic level transition at terminal 60 is from low to high, and the logic level transition at input terminal 52 is from high to low due to the presence of inverter 50. In response to the transition at terminal 60, the signal appearing at output terminal 62 of NOR gate 46 undergoes a logic level transition from high to low which turns off transistor $Q_1$. When transistor $Q_1$ turns off, current ceases to flow in its collector circuit and lamp 64 is de-energized or extinguished. Simultaneously, in response to the transition at terminal 52, the signal appearing at output terminal 56 of NOR gate 48 undergoes a logic level transition from low to high and transistor $Q_2$ is turned on. When transistor $Q_2$ is turned on, current flows through its collector circuit and energizes lamp 66. Moreover, with transistor $Q_2$ turned on, its collector terminal is effectively clamped to ground and diode $D_3$ is forward biased. At this time, however, transistor $Q_1$ is turned off, so that its collector terminal is effectively at the battery voltage and diode $D_2$ is reverse biased. Diode $D_4$, which was reverse biased before the foregoing transition in logic levels, remains reverse biased so that transistor $Q_3$ remains off. Lamp 68, therefore, remains de-energized.

Following the transition in logic levels due to the drop of the battery voltage below approximately 36.45 volts, the circuit 10 remains in the foregoing condition with transistors $Q_1$ and $Q_3$ turned off, lamps 64 and 68 de-energized, and transistor $Q_2$ turned on and lamp 66 energized. The load 70 continues to draw current from the battery, even though the battery has been drained sufficiently to cause its voltage to drop below approximately 36.45 volts. Thus, lamp 66, when energized, indicates that the battery has been drained and should be recharged although it can still safely drive the load 70. At this point, the operator should disable the load 70 and remove the battery for recharging. The operator, however, may overlook the warning provided by lamp 66 and not remove the battery for recharging. In that case, the battery continues to drive load 70 until the battery voltage reaches a second level, lower than 36.45 volts, described hereinafter.

Continued loading of the battery will eventually result in its drainage below a tolerable level, making recharging of the battery mandatory. At this point, circuit 10 automatically disconnects load 70 from the battery and indicates, by energizing lamp 68, that the battery voltage had dropped below the tolerable level. More particularly, in the preferred embodiment, when the battery voltage drops below approximately 35.91 volts, load 70 is automatically disconnected from the battery and lamp 68 is energized. Although a tolerable voltage level of approximately 35.91 volts is specified in the preferred embodiment described herein, it should be obvious that other voltage levels may also be used within the spirit and scope of the invention. As the battery voltage drops below 35.91 volts, the gate-to-source voltage of IGFET 26 decreases, causing the drain-to-source current in IGFET 26 to drop sufficiently to trigger differential amplifier 30. The signal at output terminal 32, therefore, undergoes a transition in logic levels from low to high. This is the second transition in logic levels to appear at the input of circuit 16. This second transition in logic levels appears at input 58 to NOR gate 46 and input 54 to NOR gate 48. At the time of this transition, the logic level at terminal 60 of NOR gate 46 is high, and the logic level at terminal 52 of NOR gate 48 is low. Consequently, the signal at output terminal 62 of NOR gate 46, which was previously at the low level, remains low, and the signal at output terminal 56 of NOR gate 48, which was previously at the high level, undergoes a transition to the low level. As a result, transistor $Q_1$ remains off, and transistor $Q_2$ is switched from the on condition to the off condition.

With transistor $Q_1$ off, diode $D_2$ is reverse biased, and with transistor $Q_2$ turned off, diode $D_3$ is reverse biased. Current, therefore, flows through resistor R16 and diode $D_4$, which is now forward biased, to turn on transistor $Q_3$. Since transistor $Q_3$ is now conducting, current flows through its collector circuit, energizing lamp 68.

Referring to the portion of the output indicator and driving circuit 18 which is connected to the collector terminal of transistor $Q_3$ and the load 70, resistor R19 is connected to diac 72 which, in turn, is connected to the gate terminal of SCR 74. SCR 74 is connected, at its anode, to load 70 and, at its cathode, to ground. As mentioned previously, until the battery voltage drops below approximately 35.91 volts, transistor $Q_3$ is off and its collector terminal is effectively at the battery voltage. The voltage at the collector of transistor $Q_3$, then, exceeds the forward breakover voltage of diac 72. Diac 72, then, is forward biased in the direction from the collector terminal of transistor $Q_3$ to the gate of SCR 74. As a result, SCR 74 is enabled and load 70 continues to operate in connection with the battery. When, however, the battery voltage drops below 35.91 volts, transistor Q₃ is turned on and its collector terminal is effectively clamped to ground. Accordingly, diac 72 becomes reverse biased in the direction from the collector terminal of transistor Q₃ to the gate terminal of SCR 74. Current, therefore, ceases to flow into the gate terminal of SCR 74, and SCR 74 is prevented from firing. The load 70, then, is disabled, and this condition is indicated by lamp 68, which is energized. Removal of the battery for recharging is therefore mandatory, since circuit 10 will disable load 70.

It should be noted that, if the battery has been discharged below the predetermined discharge level, designated herein as the approximate 35.91 volt level, transistor 93 will remain on until the discharged battery is replaced with a charged one. By a charged battery, it is meant a battery having a voltage greater than the predetermined discharge level.

Figure 2:
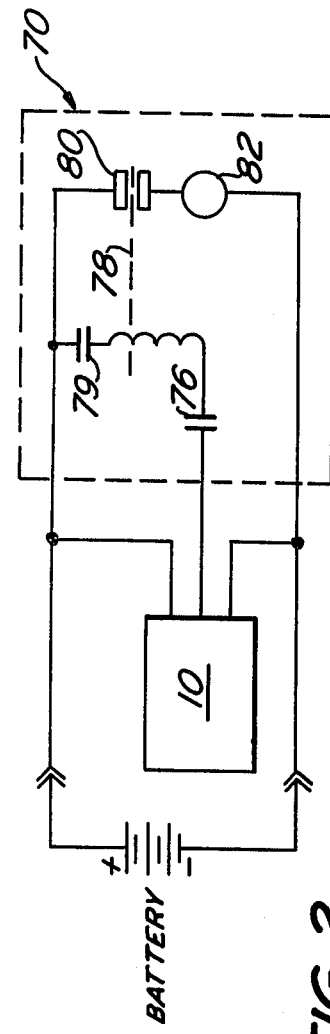
FIG. 2 is a schematic diagram of a load connected to the present invention.

Referring to FIG. 2, in a preferred application of the invention, the anode of SCR 74 is connected to a pump switch 76 which is connected, in turn, to a pump contact coil 78 and pump switch 79. When load 70 is connected to the circuit 10, switches 76 and 79 are closed. When the SCR 74 is enabled, current flows through the pump contact coil 78, causing pump contacts 80 to close. With pump contacts 80 closed the pump motor 82 is energized. When the SCR 74 is prevented from firing, pump contacts 80 open, thereby de-energizing pump motor 82. Other switch arrangements, similar to that shown in FIG. 2, may also be used in connection with circuit 10 to disable load 70 when SCR 74 is prevented from firing.

Representative values of the components of circuit 10, which provide operation as described above, are given in Table 1, below.

memorized condition. More specifically, if the battery is disconnected from the circuit during the normal operating mode, capacitor C1 will hold terminal 24 at the voltage corresponding to the battery condition at the time of disconnection. Capacitor C1 is chosen to ensure that the voltage at terminal 24, when the battery is disconnected, decays relatively slowly. Consequently, the voltage at terminal 24 remains relatively stable while the battery is disconnected. When the battery is reconnected, then, the voltage at terminal 24 will be approximately at the value at the time of disconnection, and the circuit 10 will resume operation in the normal mode. Thus, circuit 10 is relatively immune to disconnection of the battery and, to that extent, is tamper-proof.

Additionally, circuit 10 automatically provides protection against a component failure therein. In particular, if either lamp 64 or 66, or transistors Q₁ or Q₂, is defective, circuit 10 will disable load 70. Thus, if lamp 64 or transistor Q₁ is defective so that current does not flow in the collector circuit of transistor Q₁ when NOR gate output 62 goes high, diode D4 will be forward biased and transistor Q3 will be driven on to disable SCR 74. Similarly, if lamp 66 or transistor Q₂ is defective so that current does not flow in the collector circuit of transistor Q₂ when NOR gate output 56 goes high, diode D4 will be forward biased and SCR 74 will, therefore, be disabled. In both instances, lamp 68 will indicate the defective condition.

Furthermore, in light of the preceding disclosure it should be obvious that, in the normal operating mode, the circuit 10 can commence operation with transistor Q₂ on and transistors Q₁ and Q₃ off or with transistor Q₃ on and transistors Q₁ and Q₂ off. In the former case, the

TABLE 1

| Diodes | Resistors | Capacitor | Transistors | IGFET | Differential Amplifiers | Diac | SCR | Lamps |
|---|---|---|---|---|---|---|---|---|
| D1 1N4002 | R1 200Ω | C1 10μf | Q1 MPSU05 | 26 40841 | 28 Fairchild 741 TC | 72 MBS100 | 74 C106 | 24 PSB |
| D2 1N4002 | R2 12,1K | C2 10μf | Q2 MPSU05 | | 30 Fairchild 741 TC | | | 24 PBS |
| D3 1N4002 | R3 M4K | | Q3 MPSU05 | | 88 Fairchild 741 TC | | | 24 PBS |
| D4 1N4002 | R4 10K | | | | | | | |
| D5 1N4002 | R5 120Ω | | | | | | | |
| D6 1N4002 | R6 5.6K | | | | | | | |
| D7 1N5232B | R7 1K | | | | | | | |
| D8 1N4744A | R8 1K | | | | | | | |
| | R9 100K | | | | | | | |
| | R10 100K | | | | | | | |
| | R11 1.3K | | | | | | | |
| | R12 5.6K | | | | | | | |
| | R13 5.6K | | | | | | | |
| | R14 47Ω | | | | | | | |
| | R15 47Ω | | | | | | | |
| | R16 6.8K | | | | | | | |
| | R17 22K | | | | | | | |
| | R18 47Ω | | | | | | | |
| | R19 3.9K | | | | | | | |
| | R20 1K | | | | | | | |
| | R21 22M | | | | | | | |
| | R22 1M | | | | | | | |
| | R23 2.21K | | | | | | | |
| | R24 220Ω | | | | | | | |

It should be understood, however, that other components having other values may also be used to produce the transition in logic levels required to operate output indicator and driving circuit 18 within the spirit and scope of the present invention.

An additional feature of circuit 10 is that, during the normal operating mode, if the battery is suddenly disconnected from circuit 10, the circuit will memorize the last battery condition. Therefore, when the battery is reconnected to the circuit, the circuit will resume operation in the normal mode, continuing from the battery voltage is less than 35.45 volts when it is first connected to circuit 10, and the circuit keeps transistor Q₂ on until the battery voltage drops below 35.91 volts. At that point, the circuit turns off transistor Q₂ and turns on transistor Q₃, as previously described. In the latter case, the battery voltage is already less than 35.91 volts when it is first connected to circuit 10. Circuit 10, therefore, keeps transistor Q₃ on and transistors Q₁ and Q₂ off. Thus, circuit 10 will operate in the normal operating mode for a wide variety of initial battery conditions.

A further feature of the present invention is a selftest capability. That is, with the battery connected to circuit 10, the operation of the circuit can be tested either under load or no-load conditions. Under load conditions, the circuit can be tested while the battery voltage is at any of the aforementioned levels, including the predetermined discharge level which has been designated, by way of example, as approximately 35.91 volts.

Referring to the input and timing circuit 12, in the normal operating mode, switch terminal 22 is connected to switch terminal 24, and terminal 24 is connected to the gate terminal of IGFET 26 in threshold circuit 14. The connection between switch terminals 22 and 24 is provided by switch contact arm S1. In the self-test mode, however, switch 20 is temporarily depressed to disconnect switch terminals 24 and 22, and to connect switch terminals 24 and 84. Switch 20 remains depressed for the duration of a test cycle, and it may be released thereafter. Terminal 24 is connected to ground through capacitor C1, and terminal 84 is connected to ground through resistor R22. Therefore, when terminals 24 and 84 are connected, capacitor C1 and resistor R22 form an R-C discharge circuit. Assuming that terminals 22 and 24 have been connected for a sufficient period of time to charge capacitor C1, when terminals 24 and 84 are connected, capacitor C1 discharges through resistor R22 to provide an exponentially decaying voltage signal at terminal 24 and the gate terminal of IGFET 26. The IGFET 26 is controlled by this exponentially decaying signal when the system is in the self-test mode. Although, in a preferred embodiment, an R-C circuit is used to generate an exponentially decaying signal, it should be understood that other signals and circuits having predictable voltage decay rates may also be used within the spirit and scope of the invention.

Assuming that the battery is a fresh one, that is, assuming that the battery voltage is above 36.45 volts when it is initially connected to circuit 10, when switch 20 is initially depressed, capacitor C1 will be charged and the current flowing in the drain-to-source channel in IGFET 26 will be sufficient to maintain the output signal at terminal 32 of differential amplifier 30 and the output signal at terminal 40 of differential amplifier 28 at low voltage levels. In accordance with the operation of circuit 16 previously described in connection with the normal operating mode, then, transistor $Q_1$ will be on, and transistors $Q_2$ will be off. As a result, only lamp 64 will be energized. As the capacitor C1 discharges through the resistor R22, the voltage signal at terminal 24 decays exponentially. The voltage at terminal 38 gradually drops and triggers differential amplifier 28. The voltage at output 32, then, switches from low to high. At this time, the voltage at terminal 36 has also dropped, but not enough to trigger differential amplifier 30. The output signal at terminal 32 of differential amplifier 30 will therefore be low. As a result, transistor $Q_1$ and lamp 64 are driven off, transistor $Q_2$ and lamp 66 are turned on, and transistors $Q_3$ and lamp 68 remain off. In the preferred embodiment having the component values designated in Table 1 above, lamp 64 remains energized for approximately three seconds before it is turned off and lamp 66 is turned on.

While lamp 66 is on, capacitor C1 continues to discharge through resistor R22, and the voltage signal at terminal 24 continues to decay exponentially. After lamp 66 has been on for approximately one second, the voltage at terminal 36 will have dropped enough to trigger differential amplifier 30. The output signal at terminal 32 of differential amplifier 30, therefore, will switch from low to high. As a result, transistor $Q_2$ and lamp 66 turn off. At this time, transistor $Q_3$ and lamp 68 turn on, and SCR 74 is prevented from firing. As previously mentioned, the self-test operation of circuit 10 can take place with or without the load connected to the battery. If the load is connected to the battery, pump contacts 80 will open and pump motor 82 will be deenergized when transistor $Q_3$ goes on. The operator can then verify that pump motor 82 is, in fact, turned off when he observes that lamp 68 is on. The circuit 10 will remain in this condition until switch 20 is released to disconnect terminals 24 and 84 and re-connect terminal 24 to terminal 22. With terminals 22 and 24 connected, capacitor C1 recharges, the signals at output terminals 32 and 40 return to the low voltage levels, transistors $Q_2$ and $Q_3$ turn off, and transistor $Q_1$ and lamp 64 turn on. The self-test procedure may then be repeated by releasing switch 20 to permit capacitor C1 to recharge to the battery voltage and by again depressing switch 20 to reconnect terminals 84 and 24.

In the preferred embodiment described, the battery may be sufficiently discharged so that, when it is first connected to circuit 10 its voltage will be less than 36.45 volts or even 35.91 volts. In both instances, the capacitor C1 cannot be charged enough to keep both differential amplifier outputs 32 and 40 low when operation in the self-test mode commences. In particular, if the initial battery voltage is less than 36.45 volts, when self-test operation begins differential amplifier 28 will be triggered while differential amplifier 30 will not. In that case, as already explained, the differential amplifier output 40 will be high while the differential amplifier output 32 will be low. Consequently, transistor $Q_2$ will be on while transistors $Q_1$ and $Q_3$ are off. As capacitor C1 discharges, differential amplifier 30 will trigger and its output 32 will go high. Consequently, transistor $Q_3$ will go on and transistors $Q_1$ and $Q_2$ will be off. Circuit 10 will remain in this state until switch 20 is released. If the initial battery voltage is less than 35.91 volts, when operation in the self-test mode commences, capacitor C1 cannot be charged sufficiently to keep either differential amplifier outputs 32 or 40 low. In that case, as already explained, both differential amplifiers 28 and 30 will be triggered and outputs 40 and 32 will be high. Transistor $Q_3$, then, will be on while transistor $Q_1$ and $Q_2$ are off. Transistor $Q_3$ will remain in this state until switch 20 is released.

Thus, should the battery be so discharged at the commencement of self-test operation that capacitor C1 cannot keep both differential amplifiers 28 and 30 from being triggered, full self-test operation will not take place. Instead, as described above, only a partial self-test operation takes place wherein either transistors $Q_2$ and $Q_3$ are turned on in sequence while $Q_1$ remains off, or transistor $Q_3$ is the only transistor to turn on. To allow full self-test operation despite the state of discharge of the battery, circuit 10 in FIGS. 1A and B may be modified, as explained in detail hereinafter with reference to circuit 10' in FIGS. 3A and B.

Additionally, although full self-test operation is possible in circuit 10 if the battery has not been discharged below the approximate 36.45 volt level, it should be noted that, following the completion of a full self-test cycle, another self-test cycle cannot be run until switch 20 is released to allow capacitor C1 to recharge toward the battery voltage. If the operator keeps switch 20 depressed following the completion of a self-test cycle, capacitor C1 will remain discharged and transistor $Q_3$ will remain on while transistors $Q_1$ and $Q_2$ remain off. To provide an indication to the operator that he must release switch 20 before another self-test cycle can be run, circuit 10 may be modified, as explained more fully below with reference to circuit 10' in FIGS. 3A and B.

Figure 3A:
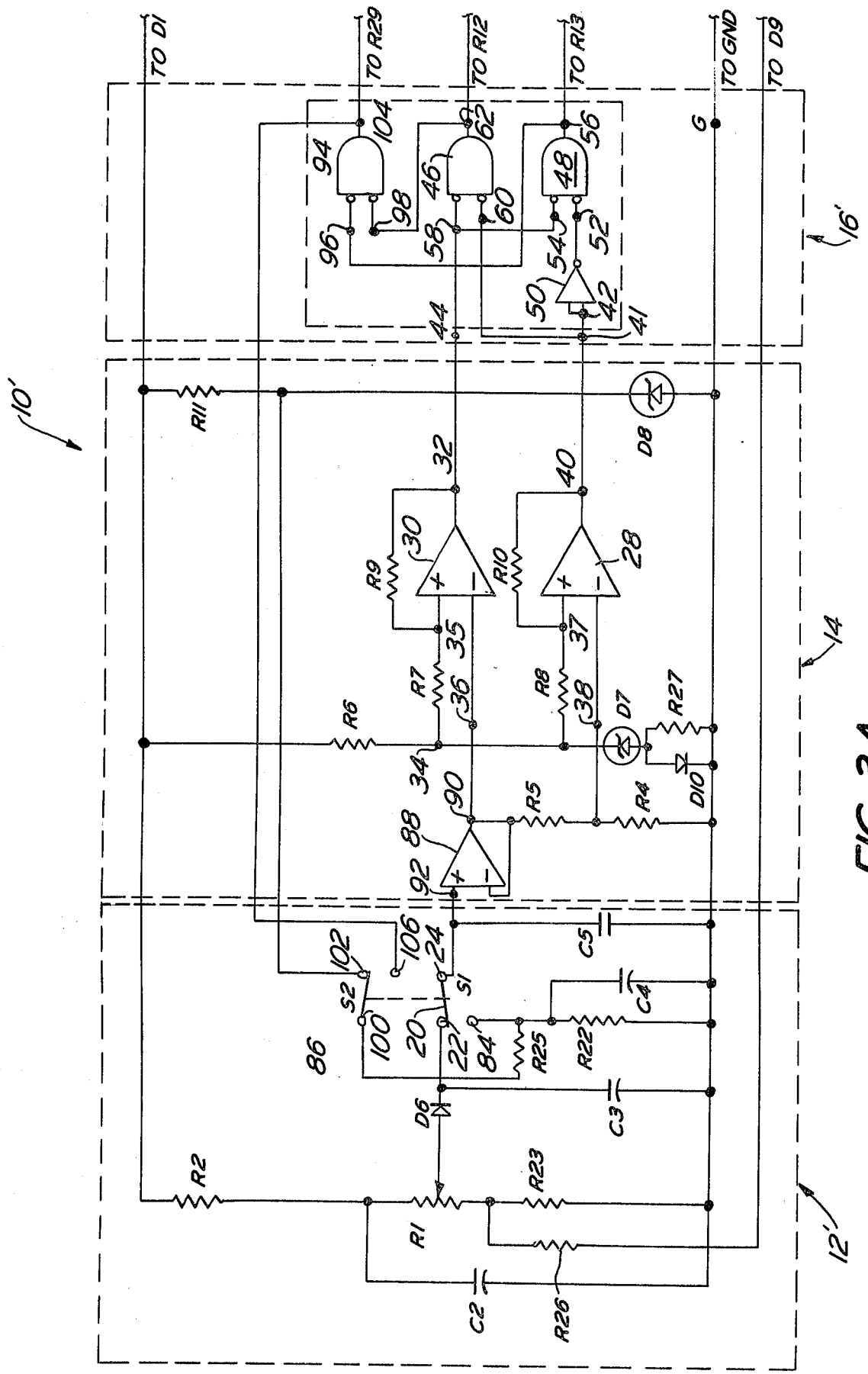
FIGS. 3A and 3B together are a schematic diagram of an alternative embodiment of a self-testing battery discharge indicator constructed in accordance with the principles of the present invention.
Figure 3B:
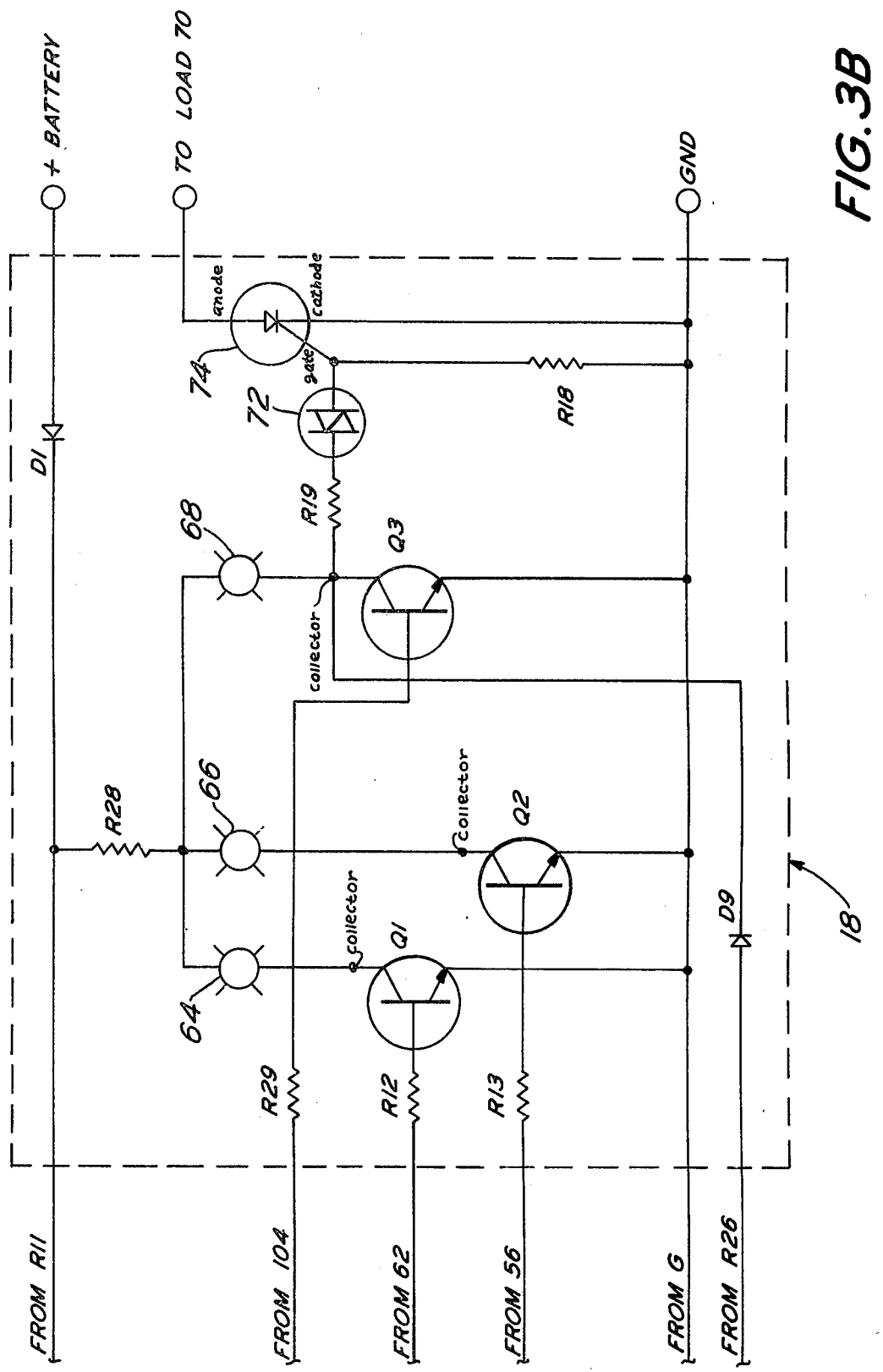

The preceding description refers to an embodiment of the invention shown in FIGS. 1A and 1B of the drawings. Another embodiment of the present invention is shown in FIGS. 3A and 3B. In describing the embodiment shown in FIGS. 3A and 3B, primed numerals indicate portions of the invention similar but not necessarily identical to the portions labeled by corresponding unprimed numerals in FIG. 1A and 1B, and like numerals indicate like elements.

Referring to FIG. 3A, the vehicle battery is connected to input and timing circuit 12'. Under normal operating conditions, the contact arm S1 of switch 20 connects switch terminal 24 to switch terminal 22. Switch terminal 24 is connected to input terminal 92 of differential amplifier 88. Differential amplifier 88 is connected to operate as a follower circuit to provide high input impedance and low output impedance for driving differential amplifiers 28 and 30. The signal at the output terminal 90 of differential amplifier 88 follows the signal at input terminal 92.

Switch 20 is mechanically coupled to switch 86 so that when contact arm S1 of switch 20 connects switch terminals 22 and 24, contact arm of S2 of switch 86 connects switch terminals 100 and 102. Switch terminal 102 is electrically connected to the battery through resistor R11, and to Zener diode D8. In the normal operating mode, capacitor C3 charges up through Diode D6, and capacitor C4 charges up through resistors R25 and R22'. Capacitor C5 serves as a noise immunity device, to prevent high frequency noise from appearing at differential amplifier output 90. Assuming the same approximate voltage levels designated previously for indicating drainage of the battery, namely, 36.45 volts and 35.91 volts, when the battery voltage is above 36.45 volts the output signal at terminal 90 of differential amplifier 88 does not trigger differential amplifier 30 or differential amplifier 28. Therefore, the outputs 40 and 32 of differential amplifiers 28 and 30 are both low. Accordingly, the signals at input terminal 58 of NOR gate 46 and terminal 42 of inverter 50 are low. Since input terminal 54 of NOR gate 48 is connected to terminal 58, the signal at terminal 54 is also low. In addition, the output of inverter 50 appears at input terminal 52 of NOR gate 48 and is high. As a result, the output signal at terminal 56 of NOR gate 48 is low and the output signal at terminal 62 of NOR gate 46 is high. NOR gate 46 is connected to transistor $Q_1$, see FIG. 3B, and NOR gate 48 is connected to transistor $Q_2$. Consequently, transistor $Q_1$ and lamp 64 are on, and transistor $Q_2$ and lamp 66 are off.

The output signal of NOR gate 46 appears at input terminal 98 of NOR gate 94, and the output signal of NOR gate 48 appears at input terminal 96 of NOR gate 94. Therefore, when terminal 62 is high and terminal 56 is low, the output signal at terminal 104 of NOR gate 94 is low. Since terminal 104 is connected to transistor $Q_3$, see FIG. 3B, transistor $Q_3$ is kept off, and lamp 68 does not go on. That is, with transistor $Q_3$ turned off, no current flows through lamp 68, and the collector terminal of transistor $Q_3$ is open, that is, the collector of transistor $Q_3$ is effectively at the battery voltage. With the collector of transistor $Q_3$ open, the forward breakover voltage of diac 74 is exceeded. Current, therefore, flows through diac 72 and enables SCR 74.

As the battery is drained, the voltage at terminal 92 decreases. Since differential amplifier 88 is connected to behave as a follower, the voltage at terminal 90 also decreases. Eventually, the battery voltage drops below 36.45 volts and the voltage at terminal 38 triggers differential amplifier 28. The output 40 of differential amplifier 28 will then go high. At the same time, the voltage at terminal 36 does not yet trigger differential amplifier 30 so that the voltage at terminal 32 of differential amplifier 30 remains low. The transition in logic levels at terminal 40, from low to high, is detected by gating logic circuit 16'. In particular, the signal at input terminal 42 of inverter 50, which was previously at a low level, undergoes a transition to a high level. The same transition appears at input terminal 60 of NOR gate 46, and the inverted transition, that is, from a high level to a low level, appears at terminal 52 due to inverter 50.

As already mentioned, the signal at output terminal 32 of differential amplifier 30 is still low and, therefore, the signals at input terminals 58 and 54 of NOR gates 46 and 48 remain low. As a result, the output signal at terminal 56 of NOR gate 48 undergoes a transition from a low level to a high level, and the output signal at terminal 62 of NOR gate 46 undergoes a transition from a high level to a low level. Accordingly, transistor $Q_1$ is driven off, and transistor $Q_2$ is switched on. As transistor $Q_1$ is driven off, lamp 64 is extinguished, and as transistor $Q_2$ is switched on, lamp 66 is energized.

The low output signal of NOR gate 46 at terminal 62 appears at input terminal 98 of NOR gate 94, and the high output signal of NOR gate 48 at terminal 56 appears at input terminal 96. The output signal at terminal 104 of NOR gate 94, therefore, remains low, and transistor $Q_3$ remains off. The SCR 74, then, remains enabled, pump contacts 80 remain closed, and pump motor 82 remains energized.

As drainage of the battery continues, the voltage at terminal 92 drops further, and the decrease in voltage at terminal 92 is followed by the signal at output terminal 90 of differential amplifier 88. Eventually, the battery will be sufficiently drained so that its voltage drops below the 35.91 volt level. At this time, the signal at terminal 36 triggers differential amplifier 30. Consequently, output 32 of differential amplifier 30 goes from low to high. The transition in logic levels at terminal 32, from low to high, is detected by gating logic circuit 16'.

More specifically, the signals at input terminals 58 and 54 of NOR gates 46 and 48 undergo a transition in logic levels from a low level to a high level. During this transition, the signal at terminal 52 remains low, and the signal at terminal 60 remains high. The signals at input terminals 58 and 60 of NOR gate 46, then, are both high and the output of NOR gate 46 at terminal 62 remains low. On the other hand, the signal at terminal 54 is now high while the signal at terminal 52 is low, and the output of NOR gate 48 at terminal 56 undergoes a transition from a high level to a low level.

Since the signal at terminal 62 remains low, transistor $Q_1$ and lamp 64 remain off and since the signal at terminal 56 is now low, transistor $Q_2$ is switched off and lamp 66 is extinguished.

Simultaneously, the output signals at terminals 62 and 56 of NOR gates 46 and 48 appear at the input terminals 96 and 98 of NOR gate 94. The output of NOR gate 94 at terminal 104, therefore, undergoes a transition in logic levels from a low level to a high level. Consequently, transistor $Q_3$ is switched on and lamp 68 is energized. With transistor $Q_3$ switched on, current flows through its collector circuit, and its collector terminal is effectively clamped to ground. Until this time, diode D9 has been reverse biased since transistor $Q_3$ was off. When $Q_3$ turns on its collector drops to ground and diode D9 becomes forward biased. Consequently, the voltage at capacitor C2 is pulled down by the clamping action of diode D9. Thus, once $Q_3$ is turned on, if the battery is disconnected, intentionally or otherwise, and then reconnected the voltage at terminal 22 of switch 20 will be sufficiently low to cause both differential amplifiers 30 and 28 to be triggered, and transistor $Q_3$ and lamp 68 will remain on. Stated otherwise, lamp 68 will not go off until the discharged battery is replaced with a charged one. Further, when $Q_3$ turns on, its collector drops below the forward breakover voltage of diac 72. Therefore, diac 72 is reverse biased and SCR 74 is prevented from firing.

A further feature of circuit 10' is its ability to reset at the beginning of the normal operating mode. That is, at the beginning of the normal operating mode, circuit 10' can be reset so that both of the transistors $Q_2$ and $Q_3$ do not go on until transistor $Q_1$ goes off. More specifically, when the battery is first connected to circuit 10', capacitors C2 and C3 are initially discharged. Consequently, with switches 86 and 20 in the position for connecting terminals 100 and 102 and terminals 22 and 24, respectively, the voltage at terminal 24 is low enough to cause outputs 32 and 40 of differential amplifiers 30 and 28 to be high. Accordingly, transistor $Q_3$ turns on upon connection of the battery, and capacitors C2 and C3 charge.

Since transistor $Q_3$ is on, diode D9 will be forward biased and will pull down the voltages at capacitors C2 and C3. Therefore, capacitors C2 and C3 are prevented, by diode D9, from charging sufficiently to cause output 32 of differential amplifier 30 to go low. As a result, transistor $Q_3$ stays on. To initiate operation in the normal mode, switches 86 and 20 are momentarily thrown to connect terminals 100 and 106 and terminals 84 and 24, respectively. Since, when transistor $Q_3$ is on, NOR gate output 104 and terminal 106 are high, capacitors C4 and C5 will charge through resistors R22' and R25 to the high voltage at terminal 106.

As capacitor C4 charges, the voltage at terminal 84 rises sufficiently to cause output 32 of differential amplifier 30 to go low. Consequently, NOR gate output 104 and the voltage at terminal 106 go low, and transistor $Q_3$ goes off. As transistor $Q_3$ goes off, diode D9 becomes reverse biased and capacitors C2 and C3 are free to charge toward the battery voltage. Switches 80 and 26 may now be released to connect terminals 100 and 102 and terminals 84 and 24, respectively. Due to the charging of capacitors C2 and C3 toward the battery voltage, the voltage at terminal 24 will be sufficiently high—assuming that the battery has not been discharged below the approximate 36.45 volt level—to cause both outputs 32 and 40 of differential amplifiers 30 and 28 to go low, turning transistors $Q_2$ and $Q_3$ off and transistor $Q_1$ on.

Of course, if the battery has been discharged so that its voltage is below the approximate 36.45 volt level but above the approximate 35.91 volt level, circuit 10' will be reset so that transistors $Q_1$ and $Q_3$ are off while transistor $Q_2$ is on. If the battery has been discharged below the predetermined discharge level, designated herein as approximately 35.91 volts, circuit 10' will reset so that transistors $Q_1$ and $Q_2$ are off while transistor $Q_3$ is on. In that case, transistor $Q_3$ will remain on, due to diode D9, as already explained, until the discharged battery is replaced with a charged one.

The foregoing description of circuit 10', shown in FIGS. 3A and 3B, pertains to its operation in the normal mode. Circuit 10', however, can also be operated in a self-test mode. In the self-test mode, switches 20 and 86 are temporarily depressed to connect switch terminal 24 to switch terminal 84, and switch terminal 100 to switch terminal 106. When circuit 10' has been reset, as explained above, output terminal 104 of NOR gate 94 is low. Terminal 104 is connected to terminal 106. Since terminal 100 is connected to terminal 106 in the self-test mode, the side of resistor R25 connected to terminal 100 will be clamped to this low level. Prior to operation in the self-test mode, capacitor C4 charges toward the Zener diode D8 voltage through switch terminals 102 and 100. When terminal 24 is connected to terminal 84, capacitor C4 will discharge through resistors R22' and R25. The discharge of capacitor C4 results in an exponentially decaying signal at terminal 92. The signal at terminal 90 follows the signal at input terminal 92 of differential amplifier 88 and, therefore, exponentially decaying signals appear at input terminals 36 of differential amplifier 30 and at input terminal 38 of differential amplifier 28. Initially, the voltages at terminals 36 and 38 are high enough to keep the signals at output terminals 40 and 32 of differential amplifiers 28 and 30 below the logic threshold voltage. The gating logic circuit 16', then, detects no transition in logic levels and transistor $Q_1$ and lamp 64 are kept on while transistors $Q_2$ and $Q_3$ and lamp 66 and 68 are off. Diode D9, then, is reverse biased. Also, diac 72 is conducting since $Q_3$ is off, and SCR 74 is enabled.

As the voltage at terminal 90 exponentially decreases, the voltage at terminal 38 drops sufficiently to trigger differential amplifier 28. The voltage at terminal 40 therefore goes from a low level to a high level. At this time, the voltage at terminal 36 has not dropped enough to trigger differential amplifier 30. Therefore, the output signal of differential amplifier 30 at terminal 32 remains low. The gating logic circuit 16', then, detects a transition in logic levels, from low to high, at input terminal 41, and NOR gate 46 drives transistor $Q_1$ and lamp 64 off while NOR gate 48 switches transistor $Q_2$ and lamp 66 on. The output of NOR gate 94 is still low, and transistor $Q_3$ and lamp 68 remain off. The collector terminal of transistor $Q_3$ is high enough to exceed the breakover voltage of diac 72, so diac 72 conducts and SCR 74 is enabled. Consequently, if the load is connected in the self-test mode, pump contacts 80 and pump motor 82 remain energized.

As capacitor C4 continues to discharge, the voltage at terminal 90 decreases sufficiently to trigger differential amplifier 30. The voltage at terminal 32, therefore, goes high. Gating logic circuit 16' will therefore detect a transition in logic levels from low to high at terminal 58. As a result, the output of NOR gate 48 at terminal 56 is low, and NOR gate 48 drives transistor $Q_2$ and lamp 66 off. In addition, the output of NOR gate 46 remains low, and transistor $Q_1$ and lamp 64 remain off.

Due to the low outputs of NOR gates 48 and 46, the input terminals 96 and 98 of NOR gate 94 are both low and, consequently, the output of NOR gate 94 is driven high, thereby turning on transistor $Q_3$ and lamp 68. With transistor $Q_3$ on, its collector terminal is driven to ground and diode D9 becomes forward biased and diac 74 becomes non-conducting. The SCR 74, therefore, is prevented from firing. This condition of circuit 10' is indicated to the operator by lamp 68.

Moreover, when the output of NOR gate 94 at terminal 104 changes to the high level, the voltage at terminal 106 of switch 86 changes identically. Thus, capacitor C4 recharges toward the high voltage at terminal 106. To put circuit 10' through another complete self-test cycle, switches 86 and 20 are momentarily released. Terminals 102 and 100, and terminals 22 and 24, therefore, respectively, are reconnected. Capacitor C4 will therefore charge towards the Zener diode D8 voltage. The self-test cycle may then be repeated by depressing switches 86 and 20 to reconnect terminals 100 and 106 and terminals 84 and 24, respectively.

With capacitor C4 charged, the voltage at terminal 84 causes the voltage at terminal 90 to increase sufficiently to drive the outputs 32 and 40 of differential amplifier 30 and 28 low. Consequently, as previously explained, the NOR gate output 104 will go low, as will the voltage at terminal 106. Capacitor C4, then, continues to discharge towards the low voltage at terminal 106, and the entire self-test cycle is repeated. Thus, the self-test feature of circuit 10' is operative even though the battery may have discharged below the predetermined discharge level. It should be noted that, in FIG. 1A, once the battery has discharged below the predetermined discharge level, the self-test feature of the circuit 10 is no longer operative. That is, once the battery has discharged below the predetermined discharge level, capacitor C1 cannot be recharged sufficiently to cause the outputs 32 and 40 of differential amplifiers 30 and 28 to go low. In contrast, in FIG. 3A, capacitor C4 can be recharged through switch 86, terminals 100 and 106 to the voltage at Zener diode D8. Thus, the self-test feature of circuit 10' remains operative despite the fact that the battery may have discharged below the predetermined discharge level.

Another tamper-proof feature of the circuit 10' shown in FIG. 3A is that lamps 66 and 68 will provide an indication that the operator is not correctly utilizing the self-test feature of the circuit. In particular, the operator may fail to release switches 86 and 20 following the completion of a self-test cycle. As mentioned previously, to repeat the self-test cycle for circuit 10', it is necessary to release switches 86 and 20 to charge capacitor C4 toward the voltage at Zener diode D8. If switches 86 and 20 are not released following the completion of a self-test cycle, terminals 100 and 106 and terminals 84 and 24, respectively, will remain connected. As a result, capacitor C4 will charge towards the voltage at terminal 106. Following the completion of a self-test cycle, the voltage at terminal 106 will be high. However, the voltage at terminal 106 is less than the voltage at diode D8 and, accordingly, capacitor C4 cannot recharge sufficiently to cause the outputs 32 and 40 of differential amplifiers 30 and 28 to both go low. Transistor $Q_1$ and lamp 64, then, will not go on if switches 86 and 20 are not released following the completion of a self-test cycle.

As capacitor C4 charges toward the high voltage at terminal 106, the voltage at terminal 84 will increase sufficiently to cause output 32 of differential amplifier 30 to go low although the output 40 of differential amplifier 28 will remain high. Accordingly, transistor $Q_3$ and lamp 68 will go off while transistor $Q_2$ and lamp 68 will go on. Transistor $Q_1$ and lamp 64 remain off. When transistor $Q_3$ goes off NOR gate output 104 goes low, and so does terminal 106. Since the operator has failed to release switches 86 and 20, terminal 100 remains connected to terminal 106, and capacitor C4 discharges through resistors R22' and R25 toward the low voltage at terminal 106. The voltage at terminal 84, then, drops sufficiently to cause the output 32 of differential amplifier 30 to go high again. The output 40 of differential amplifier 28 remains high, so transistor $Q_3$ and lamp 68 go back on while transistor $Q_2$ and lamp 68 go off. Transistor $Q_1$ and lamp 64 remain off.

When transistor $Q_3$ goes back on NOR gate output 104 and terminal 106 go high, as previously explained. Since terminal 100 is still connected to terminal 106, capacitor C4 recharges toward the high voltage at terminal 106. As capacitor C4 charges toward the high voltage at terminal 106, the voltage at terminal 84 rises sufficiently to drive the output 32 of differential amplifier 30 low while the output 40 of differential amplifier 28 remains high. Transistor $Q_3$ will then go off and transistor $Q_2$ will go on. Thus, if switches 86 and 20 are not released at the end of a complete self-test cycle, lamps 68 and 66 will be alternately energized to provide a flashing indication that the operator has failed to release the switches. It should be noted that, in FIG. 1A, if switch 20 is not released following the completion of a self-test cycle, transistor $Q_3$ will remain on while transistors $Q_1$ and $Q_2$ remain off. Thus, circuit 10, in FIG. 1A will not provide a flashing indication that the operator has failed to release switch 20 at the completion of a full self-test cycle.

It should be also noted that the circuit 10' shown in FIGS. 3A and B permits switching from a normal mode to a selftest mode and switching back to the normal mode without disturbing the normal operating cycle. That is, circuit 10' has a memorizing capability. In particular, if the operator suddenly switches from the normal operating mode to a self-test mode, capacitor C3 will retain its charge for a relatively long duration of time. That is, capacitor C3 will retain its charge while the circuit 10' operates in the self-test mode. Following completion of the self-test cycle, the operator may return circuit 10' to the normal operating mode, and the circuit will resume operation in the normal mode at its state prior to switching to the self-test mode.

This memorizing capability of circuit 10' may also be employed to safeguard against sudden disconnection and reconnection of the battery during the normal operating mode. Thus, if the battery is suddenly disconnected from circuit 10', capacitor C3 will retain its charge and, when the battery is reconnected, circuit 10' will resume operation in the normal operating mode at its state prior to disconnection of the battery. Thus, if, during the normal operating mode, the battery voltage drops below the 35.91 volt level and is then suddenly disconnected, when the battery is reconnected circuit 10' will return to the state immediately prior to disconnection of the battery. That is, transistor $Q_3$ will remain on. This is a tamper-proof feature of circuit 10' in FIGS. 3A and 3B similar to that of circuit 10 in FIGS. 1A and 1B.

Representative values for the components of circuit 10', shown in FIGS. 3A and B, are provided in Table 2, below. It should be understood, however, that equivalent components, having other values, may be substituted in the circuit within the spirit and scope of the invention.

TABLE 2

| Diodes | Resistors | Capacitors | Differential Amplifiers | Transistors | Diac | SCR | Lamps |
|---|---|---|---|---|---|---|---|
| D1 1N4002 | R1' 1K | C5 0.1μf | 28 Fairchild 741 TC | Q1 MPSU05 | 72 MBS4991 | 74 C106D1 | 24 PSB |
| D6 1N4002 | R2' 22.1K | C2 10μf | 30 Fairchild 741 TC | Q2 MPSU05 | | | 24 PBS |
| D7 1N5232B | R4' 8.2K | C3 10μf | 88 Fairchild 741 TC | Q3 MPSU05 | | | 24 PSB |
| D8 1N4744A | R5' 180Ω | C4 10μf | | | | | |
| D9 1N4002 | R6 5.6K | | | | | | |
| D10 1N4002 | R7 1K | | | | | | |
| | R8 1K | | | | | | |
| | R9 100K | | | | | | |
| | R10 100k | | | | | | |
| | R11 1.3K | | | | | | |
| | R12 5.6K | | | | | | |
| | R13 5.6K | | | | | | |
| | R18 1K | | | | | | |
| | R19 3.9K | | | | | | |
| | R22' 2.2M | | | | | | |
| | R23' 4.75K | | | | | | |
| | R25 2.2M | | | | | | |
| | R26 4.3K | | | | | | |
| | R27 120Ω | | | | | | |
| | R28 180Ω | | | | | | |
| | R29 5.6K | | | | | | |

In operation, referring to the embodiments of the present invention shown in FIGS. 1 and 3, an input and timing circuit 12 (12') is connected to a vehicle battery and generates a decreasing voltage derived from the decreasing voltage of the battery. The output of the input and timing circuit controls a threshold circuit 14 (14') which detects the decrease of the battery voltage below two separate and distinct voltage levels. As the battery voltage drops below each of the aforesaid voltage levels, the threshold circuit 14 (14') generates a digital signal. The digital signal is detected by a gating logic circuit 16 (16') which drives an output indicator and driving circuit 18 (18'). The output indicator and driving circuit 18 (18') indicates the moment at which the battery voltage drops below each of the aforesaid voltage levels, and when the battery voltage drops below the lower of the two voltage levels the output indicator and driving circuit 18 (18') disables the load 70.

Furthermore, each of the embodiments of the present invention, shown in FIGS. 1 and 3, operates in a self-test mode. In the self-test mode, an R-C discharge circuit in input and timing circuit 12 (12') generates an exponentially decaying voltage which controls the operation of threshold circuit 14 (14'). As the exponentially decaying voltage decreases below each of two voltage levels, circuit 14 (14'), 16 (16'), and 18 (18') operate to indicate the moment at which the exponentially decaying voltage drops below each of the aforementioned two voltage levels. And if the load 70 is connected to circuit 10 (10') in the self-test mode, when the exponentially decaying voltage drops below the lower of the two voltage levels, the output indicator and driving circuit 18 (18') disables the load. The operator can verify that the load 70 has in fact been disabled and that the circuit 10 (10') is functioning properly. The operation of circuit 10 (10') in the self-test mode may be repeated, permitting the operator to further verify that circuit 10 (10') is operating correctly.

In the embodiments of the invention described with respect to FIGS. 1 and 3, lamps 64, 66 and 68 are used as visual alarm devices to indicate the condition of the battery. It should be understood, however, that other alarm devices are also suitable for use in the invention. For example, audible alarm devices may be used in conjunction with, or in place of, lamps 64, 66 and 68 within the spirit and scope of the invention.

The present invention may be embodied in other specific forms without departing from the spirit or essential attributes thereof and, accordingly, reference should be made to the appended claims, rather than to the foregoing specification as indicating the scope of the invention.

I claim:

1. Apparatus for indicating the voltage of a battery and for disabling a load connected to the battery, comprising:

first indicating means for indicating that the battery voltage is greater than a first voltage level;

second indicating means for indicating that the battery voltage is less than said first voltage level but greater than a second voltage level, said second indicating means being electrically connected to said first indicating means so that when said first indicating means is energized said second energizing means is not, and when said second indicating means is energized said first indicating means is not;

third indicating means for disabling said load when the battery voltage is less than said first and second voltage levels and for indicating that the battery is less than said first and second voltage levels, said third indicating means being electrically connected to said first and second indicating means so that when either of said first and second indicating means are energized said third indicating means is not, and when said third indicating means is energized said first and second indicating means are not;

means for selectively energizing said first, second and third indicating means in response to first and second control signals;

means for sensing that the battery voltage is greater than said first voltage level, less than said first voltage level but greater than said second voltage level, and less than said first and second voltage levels and for generating said first and second control signals in response to a third control signal, said sensing means being electrically connected to said selectively energizing means; and means for selectively generating said third control signal either at a fixed decay rate independent of the actual battery voltage or in response to the actual battery voltage, said generating means being electrically connected to said sensing means.

2. Apparatus in accordance with claim 1 wherein said selectively generating means includes first generating means for generating said third control signal in response to the actual battery voltage, second generating means for generating said third control signal at a fixed decay rate independent of the actual battery voltage, and means for selectively connecting said first generating means or said second generating means to said sensing means.

3. Apparatus in accordance with claim 2 wherein said fixed decay rate is an exponential decay rate.

4. Apparatus in accordance with claim 2 wherein said selectively connecting means is a push-button switch connected to said first and second generating means and said sensing means.

5. Apparatus in accordance with claim 3 wherein said second generating means is an R-C circuit.

6. Apparatus in accordance with claim 1 wherein said sensing means includes:

third generating means for generating fourth and fifth control signals in response to said third control signal, said third generating means being electrically connected to said selectively generating means;

first comparator means for generating said first control signal in response to said fourth control signal, said first comparator means being electrically connected to said third generating means; and second comparator means for generating said second control signal in response to said fifth control signal, said second comparator means being electrically connected to said third generating means.

7. Apparatus in accordance with claim 6 wherein said third generating means is an insulated gate field effect transistor, and said first and second comparator means are differential amplifiers.

8. Apparatus in accordance with claim 1 wherein said selectively energizing means includes:

first energizing means for energizing said first indicating means when said first and second control signals are below a logic threshold voltage and for de-energizing said first indicating means when said second control signal is greater than the logic threshold voltage, said first energizing means being electrically connected to said sensing means and to said first indicating means; and second energizing means for energizing said second indicating means when said second control signal is greater than the logic threshold voltage and for de-energizing said second indicating means when said first control signal is greater than the logic threshold voltage, said second energizing means being electrically connected to said sensing means and to said second indicating means.

9. Apparatus in accordance with claim 8 wherein said first energizing means includes a first NOR gate, and said second energizing means includes an inverter and a second NOR gate, said inverter being electrically connected to said second NOR gate and said sensing means, and said second NOR gate being electrically connected to said second indicating means.

10. Apparatus in accordance with claim 1 wherein said first indicating means includes a first transistor and a first lamp electrically connected to the first transistor, said first transistor being electrically connected to said selectively energizing means; said second indicating means includes a second transistor and a second lamp electrically connected to the second transistor, said second transistor being electrically connected to said selectively energizing means; and said third indicating means includes a third transistor and a third lamp electrically connected to the third transistor, said third transistor being electrically connected to said first and second transistors so that when said first and second transistors are de-energized said third transistor is energized, and means for disabling said load when said third transistor is energized, said disabling means being electrically connected to said third transistor.

11. Apparatus in accordance with claim 10 wherein said disabling means includes a diac and a silicon controlled rectifier, said diac being electrically connected to the gate of said silicon controlled rectifier.

12. Apparatus for indicating the voltage of a battery and for disabling a load connected to the battery, comprising:

a first transistor and a first lamp electrically connected to the first transistor for indicating that the battery voltage is greater than a first voltage level;

a second transistor and a second lamp connected to the second transistor for indicating that the battery voltage is less than said first voltage level but greater than a second voltage level, said second transistor being electrically connected to said first transistor so that when said first transistor is energized said second transistor is not, and when said second transistor is energized said first transistor is not;

a third transistor and a third lamp connected to the third transistor for indicating that the battery voltage is less than said first and second voltage levels, said third transistor being electrically connected to said first and second transistors so that when either of said first and second transistors are energized said third transistor is not, and when said third transistor is energized said first and second transistors are not;

a diac and a silicon controlled rectifier electrically connected at its gate to the diac for disabling said load when the battery voltage is less than said first and second voltage levels, said diac being electrically connected to said third transistor;

a first NOR gate for selectively energizing said first transistor in response to first and second control signals, said first NOR gate being electrically connected to said first transistor;

a second NOR gate and an inverter electrically connected to said second NOR gate for selectively energizing said second transistor in response to said first and second control signals, said second NOR gate being electrically connected to said second transistor;

a first comparator for generating said first control signal in response to a fourth control signal, said first comparator being electrically connected to said first and second NOR gates;

a second comparator for generating said second control signal in response to a fifth control signal, said second comparator being electrically connected to said inverter and said first NOR gate;

an insulated gate field effect transistor for generating said fourth and fifth control signals in response to a third control signal, said insulated gate field effect transistor being electrically connected to said first and second comparators; and means for selectively generating said third control signal either at a fixed decay rate independent of the actual battery voltage or in response to the actual battery voltage, said selectively generating means being electrically connected to the gate of said insulated gate field effect transistor.

13. Apparatus in accordance with claim 12 wherein said selectively generating means includes first generating means for generating said third control signal in response to the actual battery voltage, an R-C circuit for generating said third control signal at a fixed decay rate independent of the actual battery voltage, and a switch for selectively connecting said first generating means or said R-C circuit to the gate of said insulated gate field effect transistor.

14. Apparatus for indicating the voltage of a battery and for disabling a load connected to the battery, comprising:

first indicating means for indicating that the battery voltage is greater than a first voltage level;

second indicating means for indicating that the battery voltage is less than said first voltage level but greater than a second voltage level;

third indicating means for disabling said load and for indicating that the battery voltage is less than said first and second voltage levels;

means for selectively energizing said first, second, and third indicating means in response to first and second control signals, said selectively energizing means being electrically connected to said first, second and third indicating means;

means for sensing that the battery voltage is greater than said first voltage level, less than said first voltage level but greater than said second voltage level, and less than said first and second voltage levels and for generating said first and second control signals in response to a third control signal, said sensing means being electrically connected to said selectively energizing means; and means for selectively generating said third control signal either at a fixed decay rate independent of the actual battery voltage or in response to the actual battery voltage, said selectively generating means being electrically connected to said sensing means.

15. Apparatus in accordance with claim 14 wherein said selectively generating means includes first generating means for generating said third control signal in response to the actual battery voltage, second generating means for generating said third control signal at a fixed decay rate independent of the actual battery voltage, and means for selectively connecting said first generating means or said second generating means to said sensing means.

16. Apparatus in accordance with claim 15 wherein said fixed decay rate is an exponential decay rate.

17. Apparatus in accordance with claim 15 wherein said selectively connecting means includes first and second switches, said first and second switches being mechanically coupled, said first switch being electrically connected to said selectively energizing means and said second generating means, and said second switch being electrically connected to said first and second generating means and said sensing means.

18. Apparatus in accordance with claim 15 wherein said second generating means is a R-C circuit.

19. Apparatus in accordance with claim 14 wherein said sensing means includes:

third generating means for generating fourth and fifth control signals in response to said third control signal, said third generating means being electrically connected to said selectively generating means;

first comparator means for generating said first control signal in response to said fourth control signal, said first comparator means being electrically connected to said third generating means and said selectively energizing means; and second comparator means for generating said second control signal in response to said fifth control signal, said second comparator means being electrically connected to said third generating means and said selectively energizing means.

20. Apparatus in accordance with claim 19 wherein said third generating means is a follower circuit, and said first and second comparator means are differential amplifiers.

21. Apparatus in accordance with claim 14 wherein said selectively energizing means includes:

first energizing means for energizing said first indicating means when said first and second control signals are below a logic threshold voltage and for de-energizing said first indicating means when said second control signal is greater than the logic threshold voltage, said first energizing means being electrically connected to said sensing means and to said first indicating means;

second energizing means for energizing said second indicating means when said second control signal is greater than the logic threshold voltage and for de-energizing said second indicating means when said first control signal is greater than the logic threshold voltage, said second energizing means being electrically connected to said sensing means and to said second indicating means; and third energizing means for energizing said third indicating means when said first and second control signals are both greater than the logic threshold voltage and for de-energizing said third indicating means when either said first control signal or said second control signal is less than the logic threshold voltage, said third energizing means being electrically connected to said third indicating means and to said first and second energizing means.

22. Apparatus in accordance with claim 21 wherein said first energizing means includes a first NOR gate, said second energizing means includes an inverter and a second NOR gate, said inverter being electrically connected to said second NOR gate and said sensing means and said second NOR gate being electrically connected to said second indicating means, and said third energizing means includes a third NOR gate.

23. Apparatus in accordance with claim 14 wherein said first indicating means includes a first transistor and a first lamp electrically connected to the first transistor, said first transistor being electrically connected to said selectively energizing means; said second indicating means includes a second transistor and a second lamp electrically connected to the second transistor, said second transistor being electrically connected to said selectively energizing means; and said third indicating means includes a third transistor and a third lamp electrically connected to the third transistor, said third transistor being electrically connected to said selectively energizing means, and means for disabling said load when said third transistor is energized, said disabling means being electrically connected to said third transistor and said selectively generating means.

24. Apparatus in accordance with claim 23 wherein said disabling means includes a diac and a silicon controlled rectifier electrically connected at its gate to said diac.

25. Apparatus for indicating the voltage of a battery and for disabling a load connected to the battery, comprising:
a first transistor and a first lamp electrically connected to the first transistor for indicating that the battery voltage is greater than a first voltage level;
a second transistor and a second lamp electrically connected to the second transistor for indicating that the battery voltage is less than said first voltage level but greater than a second voltage level;
a third transistor and a third lamp electrically connected to the third transistor for indicating that the battery voltage is less than said first and second voltage levels;
a diac and a silicon controlled rectifier electrically connected at its gate to said diac for disabling said load, said diac being electrically connected to said third transistor;
a first NOR gate for selectively energizing said first transistor in response to first and second control signals, said first NOR gate being electrically connected to said first transistor;
an inverter and a second NOR gate electrically connected to the inverter for selectively energizing said second transistor in response to said first and second control signals, said second NOR gate being electrically connected to said second transistor;
a third NOR gate for selectively energizing said third transistor in response to said first and second control signals, said third NOR gate being electrically connected to said third transistor and to said first and second NOR gates;
a first comparator for generating said first control signal in response to a fourth control signal, said first comparator being electrically connected to said first and second NOR gates;
a second comparator for generating said second control signal in response to a fifth control signal, said second comparator being electrically connected to said inverter and said first NOR gate;
a follower circuit for generating said fourth and fifth control signals in response to a third control signal, said follower circuit being electrically connected to said first and second comparators; and
means for selectively generating said third control signal either at a fixed decay rate independent of the actual battery voltage or in response to the actual battery voltage, said selectively generating means being electrically connected to said follower circuit.

26. Apparatus in accordance with claim 25 wherein said selectively generating means includes first generating means for generating said third control signal in response to the actual battery voltage, an R-C circuit for generating said third control signal at a fixed decay rate independent of the actual battery voltage, and means for selectively connecting said first generating means or said R-C circuit to said follower circuit.

27. Apparatus in accordance with claim 26 wherein said selectively connecting means includes first and second switches, said first and second switches being mechanically coupled, said first switch being electrically connected to the output of said third NOR gate and to said R-C circuit, and said second switch being electrically connected to said first generating means, said R-C circuit, and said follower circuit.

28. Apparatus in accordance with claim 26 including means for connecting said selectively generating means to said battery, and resetting means for de-energizing said second and third transistors when said battery is first connected to said selectively generating means.

29. Apparatus in accordance with claim 26 including means for alternately energizing said second and third transistors to provide an indication that said selectively connecting means connects said R-C circuit to said follower circuit.

30. Apparatus in accordance with claim 28 including means for preventing said third transistor from being de-energized after said battery voltage drops below both of said first and second voltage levels until said battery is replaced with a battery having a voltage at least greater than said second voltage level.

31. Apparatus in accordance with claim 26 wherein said first generating means includes storage means for storing said third control signal when said means for selectively connecting disconnects said first generating means from said follower circuit and connects said R-C circuit to said follower circuit.

32. Apparatus in accordance with claim 26 including means for connecting said selectively generating means to said battery wherein said first generating means includes storage means for storing said third control signal when said means for selectively connecting connects said first generating means to said follower circuit and said battery is disconnected from said selectively generating means.

33. Apparatus in accordance with claim 2 including means for connecting said selectively generating means to said battery wherein said first generating means includes storage means for storing said third control signal when said means for selectively connecting connects said first generating means to said sensing means and said battery is disconnected from said selectively generating means.

34. Apparatus in accordance with claim 26 wherein said means for selectively connecting includes means for sequentially energizing said first, second and third transistors although said battery voltage is less than either said first or second voltage levels.

35. Apparatus in accordance with claim 10 including means for energizing said third indicating means when either said first or second indicating means is defective.

* * * * *